US012587030B2

(12) United States Patent
Lee et al.

(10) Patent No.: US 12,587,030 B2
(45) Date of Patent: Mar. 24, 2026

(54) POWER SUPPLY SWITCHING SYSTEM AND SWITCH APPARATUS

(71) Applicant: Fulian Precision Electronics (Tianjin) Co., LTD., Tianjin (CN)

(72) Inventors: Wei-Ming Lee, New Taipei (TW); Chi-Wen Chen, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 99 days.

(21) Appl. No.: 18/804,354

(22) Filed: Aug. 14, 2024

(65) Prior Publication Data

US 2025/0300490 A1     Sep. 25, 2025

(30) Foreign Application Priority Data

Mar. 25, 2024     (CN) .......................... 202410344953.3

(51) Int. Cl.
*H02J 9/06*          (2006.01)
*H05K 7/20*          (2006.01)

(52) U.S. Cl.
CPC .......... *H02J 9/068* (2020.01); *H05K 7/20909* (2013.01)

(58) Field of Classification Search
CPC ....................................................... H02J 9/068
USPC ............................................................ 307/43
See application file for complete search history.

(56) References Cited

FOREIGN PATENT DOCUMENTS

TW          202227932 A     7/2022
WO      WO-2024176521 A1 *   8/2024   .............. H02M 7/48

* cited by examiner

*Primary Examiner* — Daniel Kessie
*Assistant Examiner* — Dru M Parries
(74) *Attorney, Agent, or Firm* — ScienBiziP, P.C.

(57)                ABSTRACT

A power supply switching system includes a switch controlling apparatus, at least two switch apparatuses, alternating current (AC) powers, and a power shelf. The power shelf includes at least two AC inputting ends. Each of the at least two switch apparatuses is electrically connected between one of the AC inputting ends and the AC powers. A number of the AC powers is less than a number of the at least two AC inputting ends. The switch controlling apparatus is electrically connected with each of the at least two switch apparatuses, and controls the at least two switch apparatuses to turn on or turn off. The power supply switching system saves a number of the AC powers while executing an ATS test, thus an efficiency of the power shelf is improved. A switch apparatus is also provided.

9 Claims, 5 Drawing Sheets

10

POWER SUPPLY SWITCHING SYSTEM AND SWITCH APPARATUS

TECHNICAL FIELD

The present application generally relates to server technology, and particularly to a power supply switching system and a switch apparatus.

BACKGROUND

With a development in technologies, such as big data and artificial intelligence, servers in a large-scale are widely used. A power shelf for powering loads, such as the servers, and the like, includes multiple power supply units (PSUs). The PSUs are powered by at least two alternating current (AC) powers. While testing an automatic transfer switch (ATS) unit in the power shelf, the power shelf still needs to be connected with the at least two AC powers, thus an efficiency of testing is low.

There is room for improvement in the art.

BRIEF DESCRIPTION OF THE DRAWINGS

Implementations of the present application will now be described, by way of example only, with reference to the attached figures.

DETAILED DESCRIPTION

Figure 1:
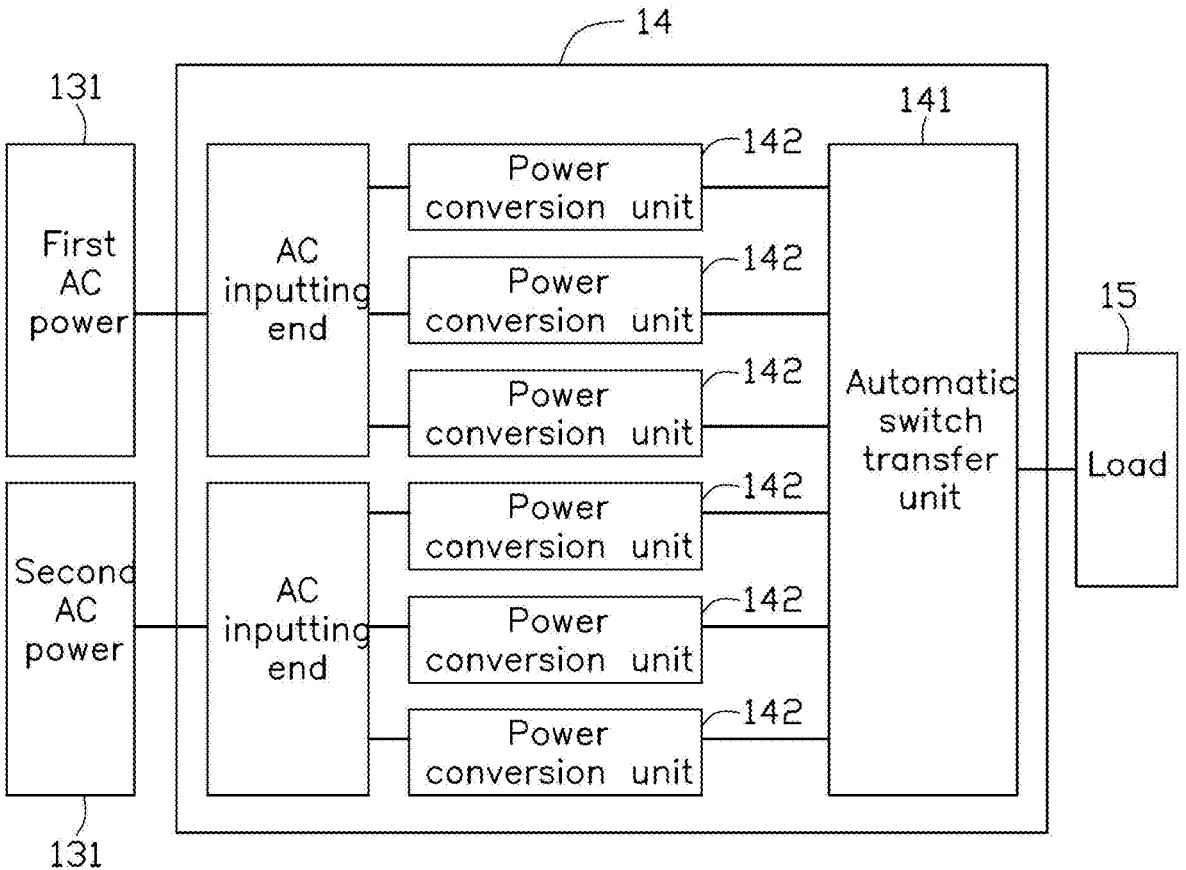
FIG. 1 is a diagram illustrating an embodiment of a power shelf according to the present application.

The technical solutions in the embodiments of the present application will be clearly and completely described below which combine with reference to the accompanying drawings in the embodiments of the present application. Apparently, the described embodiments are some of the embodiments of the present application rather than all of the embodiments. Based on the embodiments of the present application, it is understandable to a person skilled in the art, any other embodiments obtained by persons skilled in the art without creative effort shall all fall into the scope of the present application. It will be understood that the specific embodiments described herein are merely some embodiments and not all.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The application is illustrated by way of example and not by way of limitation in the figures of the accompanying drawings in which like references indicate similar elements. It should be noted that references to "an" or "one" embodiment in this application are not necessarily to the same embodiment, and such references can mean "at least one."

It should be understood that, the connection relationship described in this application, indicates a direct or indirect connection. For example, connecting between A and B may be a direct connection between A and B, or may be indirect connection between A and B by using one or more other electronic components. For example, A is directly connected to C, and C is directly connected to B, so that A is connected to B by using C.

In the description of the present application, unless other specified, "/" means "or", for example, "A/B" may mean "A" or "B". The term "and/or" is used to describe an association relationship for describing associated objects, and indicates that three relationships may exist. For example, "A and/or B" may represent the following three cases: Only A exists, only B exists, and both A and B exist, where A and B may be singular or plural.

In the description of the present application, terms "first", "second", and the like used in the specification, the claims, and the accompanying drawings of the present application are used to distinguish between same items or different objects, and do not constitute any limitation on a quantity and an execution order, and the terms "first" and "second" do not mean being definitely different either. Besides, the terms "including" and "having" and any variations thereof in the description of the present application are intended to cover non-exclusion.

With a development in technologies, such as big data and artificial intelligence, servers in a large-scale are widely used. A power shelf for powering loads, such as the servers, and the like, includes multiple power supply units (PSUs). The PSUs are powered by at least two alternating current (AC) powers. While testing an automatic transfer switch (ATS) unit in the power shelf, the power shelf still needs to be connected with the at least two AC powers, thus an efficiency of testing is low.

In detail, referring to FIG. 1, FIG. 1 shows a diagram of an embodiment of a power shelf 14. The power shelf 14 includes an automatic switch transfer unit 141, N alternating current (AC) inputting ends, and at least two power conversion units 142. The automatic switch transfer unit 141 is electrically connected between the at least two power conversion units 142 and a load 15.

An inputting terminal of each power conversion unit 142 is electrically connected with one of the AC inputting ends. The power shelf 14 including six automatic switch transfer units 141 and two AC inputting ends as an example for illustrating the present application will be described as below. Three of the six power conversion units 142 are connected with one of the two AC inputting ends, for being powered by a first AC power 131 through the corresponding AC inputting ends. The rest of the six power conversion units 142 are connected with another one of the two AC inputting ends, for being powered by a second AC power 133 through the corresponding AC inputting ends.

An outputting terminal of each power conversion unit 142 is electrically connected with the automatic switch transfer unit 141. The automatic switch transfer unit 141 is configured to select at least one of the power conversion units 142 to connect with and the load 15. Specifically, when a voltage inputted into at least one of the power conversion units 142 is less than a predefined threshold, the automatic switch transfer units 141 may selects the at least one power conversion unit 142, the inputting voltage of which is less than the predefined threshold, to connect with the load 15, and select the power conversion units 142, the inputting voltage of which is larger than or equal to the predefined threshold, to connect with the load 15.

The automatic switch transfer unit 141 may detect the inputting voltage and outputting voltage of each power conversion unit 142 by electronic components, such as a voltage sensor. When the inputting voltage of one of the power conversion units 142 is less than the predefined threshold, it indicates that a fault exists in the corresponding AC power 13 being connected with the power conversion unit 142, the inputting voltage of which is less than the predefined threshold, therefore an fault exists while the AC power 13 supplies a power to the corresponding power conversion unit 142, thus the corresponding power conversion unit 142 is unable to work normally for powering the load 15. Meanwhile, for ensuring the power shelf 14 to power the load 15 steadily and continuously, when detecting the power conversion unit 142 being unable to work normally, the automatic switch transfer unit 141 may turn off the electrical connection between the power conversion unit 142 being unable to work normally and the load 15, and turn on the electrical connection between the power conversion unit 142 being able to work normally and the load 15.

As the recited above, an ATS test is used for testing whether the automatic switch transfer unit 141 in the power shelf 14 works normally. In the ATS test, for testing whether the automatic switch transfer unit 141 works normally, it needs to simulates a situation of at least one of the power conversion units 142 being unable to work normally, based on that, a working state of each automatic switch transfer unit 141 is used for determining that whether the automatic switch transfer unit 141 work normally. For example, when there is faults in the three power conversion units 142 electrically connected with the first AC power 131 through the inputting terminals, if the automatic switch transfer unit 141 turns off the electrical connections between the three power conversion units 142 being unable to work normally and the load 15, and turns on the electrical connections between the rest three power conversion units 142 working normally and the load 15, it indicates that the automatic switch transfer unit 141 works normally, and the power shelf 14 passes the ATS test, otherwise the power shelf 14 fails to pass the ATS test.

Based on above, in the ATS test, the simulation is achieved by using a number of the AC powers 13 being equal to the number of the inputting terminals of the power shelf 14, for simulating situations of different power conversion units 142 being unable to work normally, the different AC powers 13 connecting with the different power conversion units 142 are controlled for stopping outputting the voltage. However, a cost in manufacturing the AC powers 13 is high, which cause a number of the AC powers 13 to be less, and the number of the inputting terminals of the power shelf 14 is larger, if the number of the AC powers 13 is equal to the inputting terminals of the power shelf 14, an efficiency of the power shelf 14 while executing the ATS test is low, and a cost is high.

Therefore, the present application provides a power supply switching system 10 and a switch apparatus, for saving the number of the AC powers required by the power shelf 14 while executing the ATS test, thus the efficiency of the power shelf 14 while executing the ATS test is improved.

Figure 2:
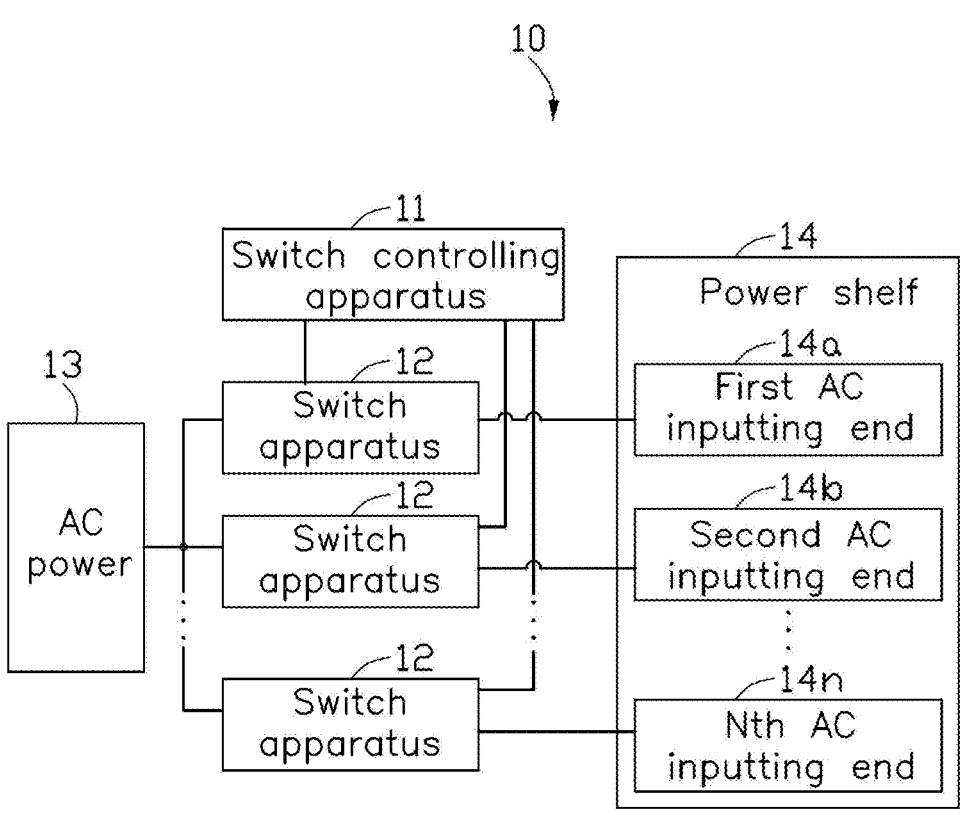
FIG. 2 is a diagram illustrating an embodiment of a power supply switching system according to the present application.

Specifically, referring to FIG. 2, FIG. 2 shows a diagram of the power supply switching system 10 of the present application. The power supply switching system 10 includes a switch controlling apparatus 11, at least two switch apparatus 12, AC powers 13, and a power shelf 14. The power shelf 14 includes N AC inputting ends, which include first to Nth AC inputting ends 14a, 14b, . . . , 14N. N is an integer larger than 2.

Each switch apparatus 12 is electrically connected between the AC powers 13 and the power shelf 14. In detail, a number of the switch apparatuses 12 is confirmed by a number of the AC inputting ends of the power shelf 14. For example, the power shelf 14 includes N AC inputting ends, and the number of the switch apparatuses 12 is also N, for corresponding to the N AC inputting ends.

The AC power 13 is configured to power the power shelf 14 through the switch apparatuses 12. The power shelf 14 may receive an alternating current from each AC inputting end, thus application scenarios of powering each AC power 13 by each AC inputting end while executing the ATS test may be simulated.

The switch controlling apparatus 11 is electrically connected with the each switch apparatus 12. The switch controlling apparatus 11 is configured to control each switch apparatus 12 to be turned off or turned on.

A number of the AC powers 13 is less than a number of the AC inputting ends in the power shelf 14. In other words, one AC power 13 may supply powers to multiple AC inputting ends. For example, in one embodiment of the present application, one AC power 13 supplies powers to the NAC inputting ends. Therefore, while the power shelf 14 executes the ATS test, if a situation of simulating at least some of the AC powers 13 existing an fault is needed, the switch apparatuses 12 corresponding to the at least some of the AC powers 13 existing the fault in the simulating situation are turned off by the switch controlling apparatus 11, thus the corresponding AC inputting ends are disconnected with the at least some of the AC powers 13, a result and an effect of the situation of simulating the at least some of the AC powers 13 existing the fault are same as the at least some of the AC powers 13 existing the fault in actual.

By comparing with a power supply structure of the power shelf 14 requiring redundancy powers while executing the ATS test, which uses multiple AC powers 13 corresponding to multiple AC inputting ends of the power shelf 14, the number of the AC powers 13 used in the present application is less than the number of the AC inputting ends in the power shelf 14, and the AC powers 13 cooperate with the switch apparatuses 12 served as the redundancy powers of the power supply structure. The number of the AC powers 13 required of the power shelf 14 while executing the ATS test is reduced, and an test efficiency is improved.

In some embodiments, the switch controlling apparatus 11 may be a hardware device, such as a computer, a microprocessor, a controller, and the like, and control the switch apparatus 12 to be turned on or turned off by means of controlling instructions, controlling signals, and the like.

Figure 3:
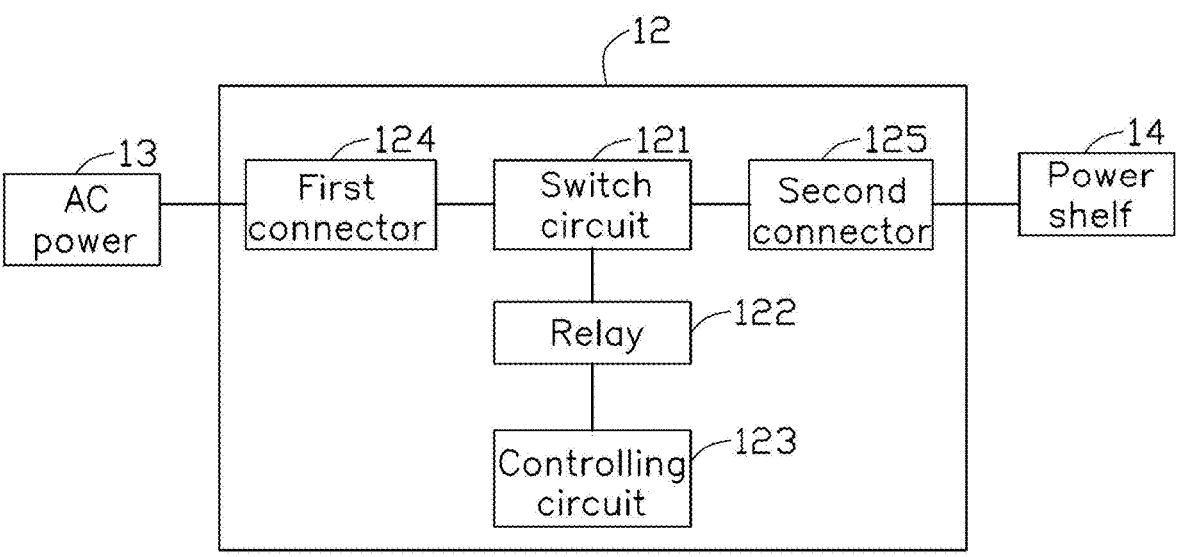
FIG. 3 is a diagram illustrating of a switch apparatus according to the present application.

Referring to FIG. 3, the structure of the switch apparatus 12 will described as below.

Referring to FIG. 3, FIG. 3 shows a diagram of an embodiment of the switch apparatus 12. The switch apparatus 12 includes a switch circuit 121, a relay 122, a controlling circuit 123, a first connector 124, and a second connector 125.

The first connector 124 includes multiple couples of first connecting terminals. One of the first connecting terminals in each couple of the first connector 124 is electrically connected with the AC power 13, and another of the first connecting terminal in each couple of the first connector 124 is electrically connected with the switch circuit 121. Thus, the first connector 124 establishes an electrical connection between the AC power 13 and the switch circuit 121.

The second connector 125 includes multiple couples of second connecting terminals. One of the second connecting terminals in each couple of the second connector 125 is electrically connected with one of the AC inputting ends of the power shelf 14, and another of the second connecting terminals in each couple of the second connector 125 is electrically connected with the switch circuit 121. Thus, the second connector 125 establishes an electrical connection between the power shelf 14 and the switch circuit 121.

The controlling circuit 123 is electrically connected with the switch circuit 121 through the relay 122. Specifically, the controlling circuit 123 is configured to receive the controlling instructions, the controlling signals, and the like outputted by the switch controlling apparatus 11, and control the relay 122 to be turned on or turned off according to the received controlling instructions, the controlling signals, and the like outputted by the switch controlling apparatus 11. The state of the relay 122 being turned on or turned off is related to states of the switch circuit 121 being turned on or turned off. For example, when the relay 122 turns on, the switch circuit 121 also turns on, the AC power 13 supplies the power to the power shelf 14. When the relay 122 turns off, the switch circuit 121 also turns off, the AC power 13 stops supplying the power to the power shelf 14.

Figure 4:
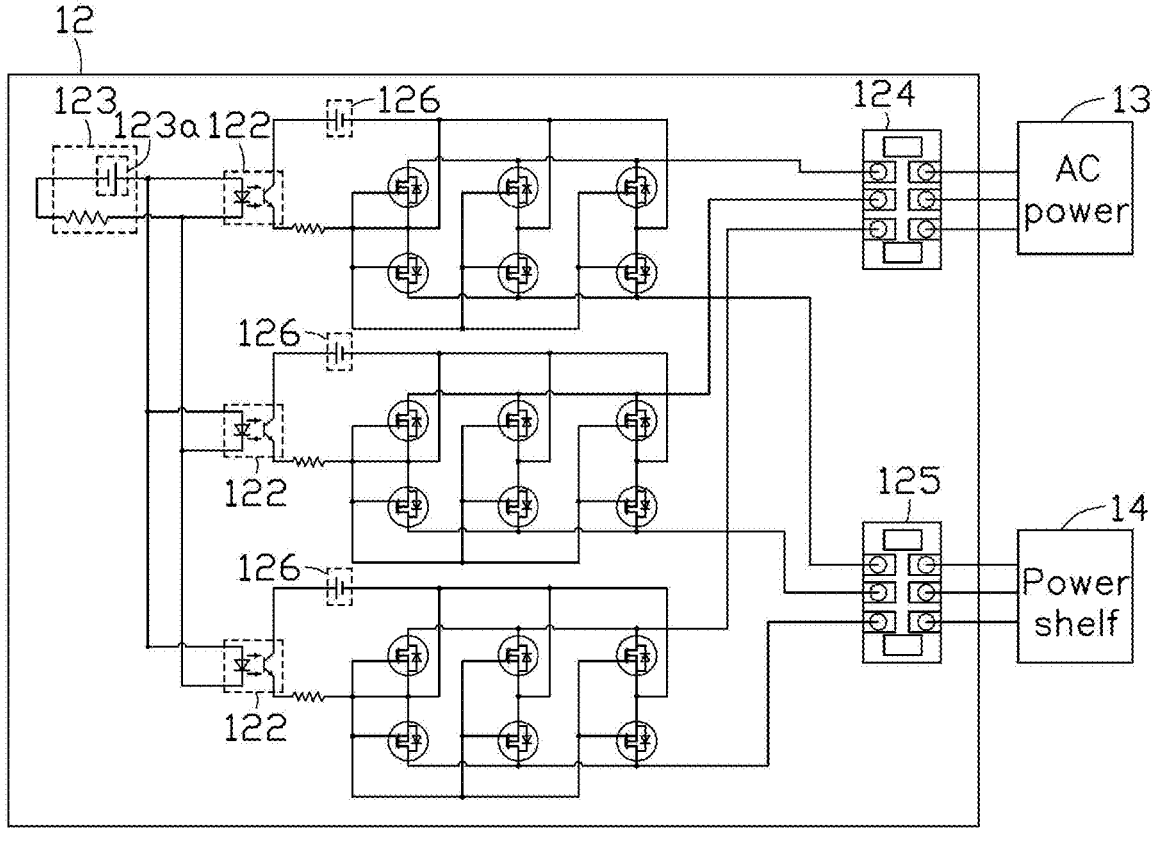
FIG. 4 is a circuit diagram illustrating of the switch apparatus of FIG. 3 according to the present application.

Referring to FIG. 4, FIG. 4 shows a circuit diagram of the switch apparatus 12.

In some embodiments, the controlling circuit 123 may be an Arduno circuit, which is equivalent to a controlled power 123*a*, the relay 122 may be an optocoupler. Two electrodes of a light emitting diode in the relay 122 are electrically connected with positive and negative terminals of the controlled power 123*a* respectively. When the controlling circuit 123 receiving the controlling instructions or the controlling signals to be turned on, the light emitting diode in the relay 122 turns on and emitting light according to a voltage outputted by the equivalent controller power 123*a*, and a photosensitive transistor in the relay 122 turns on. Thus, the relay 122 turns on. When the controlling circuit 123 receiving the controlling instructions or the controlling signals to be turned off, the equivalent controller power 123*a* stops outputting the voltage, and the light emitting diode in the relay 122 turns off and stops emitting, and the photosensitive transistor in the relay 122 turns off. Thus, the relay 122 turns off.

In some embodiments, the switch circuit 121 includes at least two switch transistor bridge arms. A switch transistor of an upper bridge arm in each switch transistor bridge arm is electrically connected with the first connector 124 for receiving the voltage outputted by the AC power 13 through the first connector 124. A switch transistor of a lower bridge arm in each switch transistor bridge arm is electrically connected with the second connector 125 for electrically connecting with one of the AC inputting ends of the power shelf 14. Based on the connection relationship, when both of the switch transistors of the upper bridge arm and the lower bridge arm turn on, the voltage outputted by the AC power 13 is transmitted to the AC inputting end of the power shelf 14. The switch apparatus 12 is in a turn-on sate, the AC power 13 supplies the power to the power shelf 14. When both of the switch transistors of the upper bridge arm and the lower bridge arm switch transistor turn off, the voltage outputted by the AC power 13 fails to be transmitted to the AC inputting end of the power shelf 14. The switch apparatus 12 is in a turn-off state, and the AC power 13 stops supplying the power to the power shelf 14.

In some embodiments, the number of the switch transistor bridge arms is confirmed based on a current outputted by the AC power 13. For example, with the increasing of the current outputted by the AC power 13, the number of the switch transistor bridge arms are increased, for meeting a requirement of the number of the switch transistors under a larger current.

In some embodiments, the switch apparatus 12 includes a direct current (DC) power 126. The DC power 126 may be a circuit component for providing a direct current, such as a DC voltage conversion board, a battery, and the like. A positive terminal of the DC power 126 is electrically connected with a terminal of the photosensitive transistor, and another terminal of the photosensitive transistor is electrically connected with controlling terminals of the switch transistors of the upper bridge arm and the lower bridge arm. When the switch transistors of the upper bridge arm and the lower bridge arm are MOS transistors, the controlling terminals are gate electrodes of the MOS transistors. When the switch transistors of the upper bridge arm and the lower bridge arm are triodes, the controlling terminals are base electrodes of the triodes, and so on. The negative terminal of the DC power 126 is electrically connected with a middle point in each of the at least two switch transistor bridge arms of the switch circuit 121. When the relay 122 turns on, the voltage outputted by the DC power 126 serves as a controlling voltage and outputs to the controlling terminal of the switch transistor in each upper bridge arm and each lower bridge arm, the switch transistors of the upper bridge arm and the lower bridge arm turn on, and the switch apparatus 12 is in the turn-on state. Similarly, when the relay 122 turns off, the DC power 126 stops outputting the voltage, the switch transistors of the upper bridge arm and the lower bridge arm turn off, the switch apparatus 12 is in the turn-off state.

In some embodiments, the AC power 13 may include multiple outputting terminals for outputting polyphase alternating currents. For example, when outputting three-phase alternating current, the AC power 13 includes three outputting terminals, each outputting terminal corresponds to a phase of the alternating current. Correspondingly, both of the first connector 124 and the second connector 125 include three couples of the second connecting terminals, and there are three switch circuit 121. Each AC inputting end in the power shelf 14 includes an inputting terminal for receiving a phase of the alternating current. Each couple of the first connecting terminals of the first connector 124 is electrically connected with one of the outputting terminals of the AC power 13 and one of the switch circuit 121. Each couple of the second connecting terminals of the second connector 125 is electrically connected with the switch circuit 121 and one of the inputting terminals of the AC inputting ends of the power shelf 14. In other words, each switch circuit 121 is configured to turn on or turn off an electrical connection between one of the outputting terminals of the AC power 13 for outputting a phase of the alternating current and one of the inputting terminals of the AC inputting ends of the power shelf 14.

In some embodiments, there is a heat sink disposed on each switch transistors of the upper bridge arm and the lower bridge arm for dissipating heat generated by the switch transistors of the upper bridge arm and the lower bridge arm while working.

Figure 5:
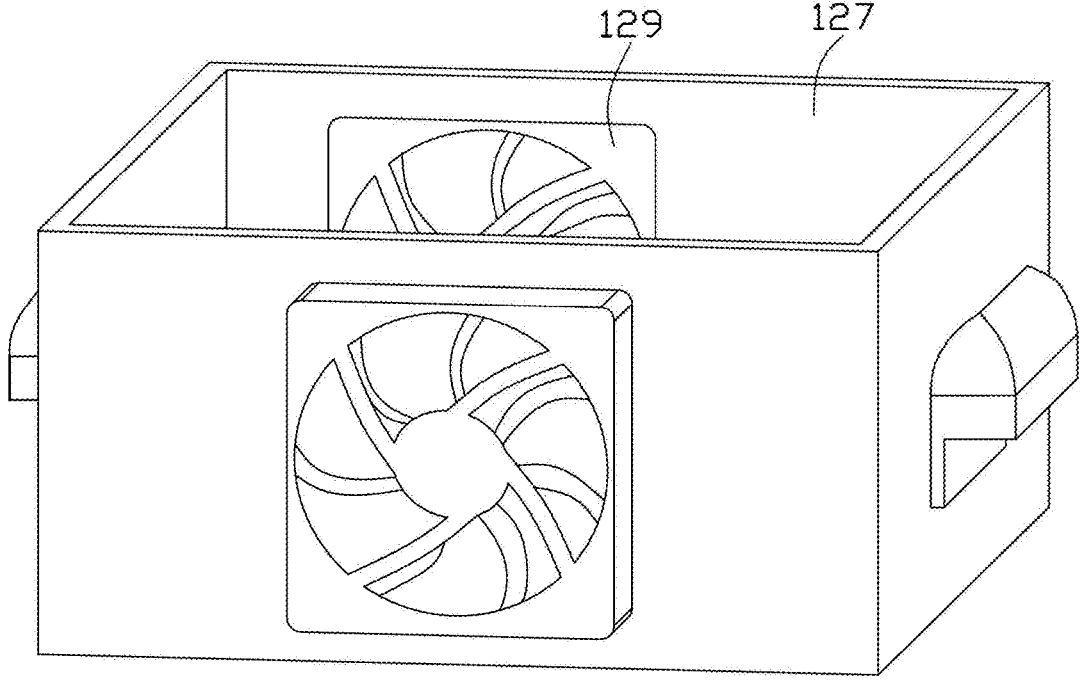
FIG. 5 is a diagram illustrating of a switching apparatus according to the present application.

Referring to FIG. 5, FIG. 5 shows a diagram of the switch apparatus 12. The switch apparatus 12 further includes a casing 127 and a heat dissipation fan 129. The heat dissipation fan 127 is disposed on the casing 127 for besides the casing 127. The switch circuit 121, the relay 122, the controlling circuit 123, the first connector 124, and the second connector 125 are received in the casing 127.

Therefore, the power supply switching system 10 and the switch apparatus 12 provided by the present application may save a number of the AC powers 13 while executing the ATS test, thus the efficiency of the power shelf 14 is improved.

Those skilled in the art will recognize that the above described embodiments are only intended to illustrate the invention and are not intended to limit the invention, and numerous possible modifications and variations within the spirit of the invention will fall within the scope of the invention.

What is claimed is:

1. A power supply switching system comprises a switch controlling apparatus, at least two switch apparatuses, alternating current (AC) powers, and a power shelf, wherein the power shelf comprises at least two AC inputting ends; each of the at least two switch apparatuses is electrically connected between one of the AC inputting ends and the AC powers; a number of the AC powers is less than a number of the at least two AC inputting ends; the switch controlling apparatus is electrically connected with each of the at least two switch apparatuses, and controls the at least two switch apparatuses to turn on or turn off;

the switch apparatus comprises a switch circuit and a relay, and receives a controlling voltage through the relay, wherein the switch circuit comprises at least two switch transistor bridge arms; each of the at least two switch transistor bridge arms comprises at least two switch transistors; one of the at least two switch transistors as an upper bridge arm receives the voltage outputted by the AC power; another of the at least two switch transistor as a lower bridge arm is electrically connected with one of the AC inputting ends of the power shelf;

a middle point in each of the at least two switch transistor bridge arms is electrically connected with a negative terminal of a direct current (DC) power; controlling terminals of the switch transistors in the upper bridge arm and the lower bridge arm are electrically connected with a positive terminal of the DC power through the relay; the DC power is configured to output the controlling voltage; in response to the relay is turned on, the controlling voltage output by the DC power is output to the controlling terminals of the switch transistors.

2. The power supply switching system of claim 1, wherein the power shelf comprises at least two power conversion units and an automatic switch transfer unit; an inputting terminal of each of the at least two power conversion units is electrically connected with one of the AC inputting ends, an outputting terminal of each of the at least two power conversion units is electrically connected with the automatic switch transfer unit; the automatic switch transfer unit is electrically connected with a load; the automatic switch transfer unit is configured to select at least one of the power conversion units and to connect the selected power conversion unit with the load.

3. The power supply switching system of claim 2, wherein when an inputting voltage of at least one of the at least two power conversion units is less than a predefined threshold, the automatic switch transfer unit selects the at least one power conversion unit of which the inputting voltage is less than the predefined threshold, to disconnect with the load; the automatic switch transfer unit further selects the power conversion units, from the at least two power conversion units, of which the inputting voltage are larger than or equal to the predefined threshold, to connect with the load.

4. A switch apparatus electrically connected between an alternating current (AC) power and a power shelf, the switch apparatus being further electrically connected with a switch controlling apparatus; the power shelf having at least two AC inputting ends; the switch apparatus being electrically connected between one of the AC inputting ends and the AC power, the switch apparatus comprising a switch circuit and a relay, wherein the switch circuit comprises at least two switch transistor bridge arms; each of the at least two switch transistor bridge arms comprises at least two switch transistors; one of the at least two switch transistors as an upper bridge arm receives the voltage outputted by the AC power; another of the at least two switch transistor as a lower bridge arm is electrically connected with one of the AC inputting ends of the power shelf; controlling terminals of the switch transistors in the upper bridge arm and the lower bridge arm are electrically connected with the relay, and receives a controlling voltage through the relay; when the relay turns on, the switch circuit turns on for powering the power shelf by the AC power; when the relay turns off, the switch circuit turns off for stopping powering the power shelf by the AC power;

wherein a middle point in each of the at least two switch transistor bridge arms is electrically connected with a negative terminal of a direct current (DC) power; the controlling terminals of the switch transistors in the upper bridge arm and the lower bridge arm are electrically connected with a positive terminal of the DC power through the relay; the DC power is configured to output the controlling voltage; when the relay turns on, the controlling voltage outputted by the DC power is outputted to the controlling terminals of the switch transistors.

5. The switch apparatus of claim 4, further comprising a controlling circuit, wherein the controlling circuit is electrically connected to the relay and the switch controlling apparatus; the controlling circuit receives controlling instructions outputted by the switch controlling apparatus, and controls the relay to turn on or turn off according to the received controlling instructions.

6. The switch apparatus of claim 4, further comprising at least one first connector and at least one second connector, wherein the first connector is configured to electrically connected with the AC power; each of the switch transistors of the upper bridge arm in each switch transistor bridge arm is electrically connected with the first connector, for receiving a voltage outputted by the AC power; each of the switch transistors of the lower bridge arm in each switch transistor bridge arm is electrically connected with the one of the AC inputting ends of the power shelf through the second connector.

7. The switch apparatus of claim 4, wherein the relay is an optocoupler; two electrodes of a light emitting diode in the optocoupler are electrically connected with the controlling circuit; a terminal of a photosensitive transistor in the optocoupler is electrically connected with the positive terminal of the DC power, and another terminal of the photosensitive transistor in the optocoupler is electrically connected with the controlling terminals of the switch transistors in the upper bridge arm and the lower bridge arm.

8. The switch apparatus of claim 6, wherein the AC power has at least two outputting terminals; each outputting terminal is configured to output a phase of an alternating current; each AC inputting end has at least two AC inputting terminals for receiving the phase of the alternating current; the first connector comprises at least two first connecting terminals, and the second connector comprises at least two second connecting terminals; each of the at least two first connecting terminals is electrically connected with the switch transistor of the upper bridge arm in the switch circuit; each of the at least two second connecting terminals is electrically connected with one of the AC inputting terminals.

9. The switch apparatus of claim 6, further comprising a casing, a heat sink, and a heat dissipation, wherein the heat sink is disposed on each of the switch transistors of the upper bridge arm and the lower bridge arm; and the heat dissipation fan is disposed on the casing.

\* \* \* \* \*